United States Patent
Sato

(10) Patent No.: US 8,044,522 B2
(45) Date of Patent: Oct. 25, 2011

(54) SEMICONDUCTOR DEVICE

(75) Inventor: Hideo Sato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/562,654

(22) Filed: Sep. 18, 2009

(65) Prior Publication Data

US 2010/0109146 A1 May 6, 2010

(30) Foreign Application Priority Data

Nov. 4, 2008 (JP) .................................. 2008-283128

(51) Int. Cl.
 *H01L 23/48* (2006.01)
 *H01L 23/52* (2006.01)
 *H01L 23/40* (2006.01)
(52) U.S. Cl. ........................................ 257/784; 257/786
(58) Field of Classification Search .................. 257/686, 257/777, 723, 724, 784, 786
See application file for complete search history.

(56) References Cited

U.S. PATENT DOCUMENTS

| | | | |
|---|---|---|---|
| 6,727,590 B2* | 4/2004 | Izumitani et al. | 257/758 |
| 2003/0151149 A1* | 8/2003 | Ichikawa | 257/784 |
| 2008/0128826 A1* | 6/2008 | Fukamizu et al. | 257/379 |
| 2010/0159690 A1* | 6/2010 | Kasaoka et al. | 438/612 |
| 2010/0320600 A1* | 12/2010 | Pratt | 257/737 |

FOREIGN PATENT DOCUMENTS

| JP | 3-227540 | 10/1991 |
|---|---|---|
| JP | 2005-223172 | 8/2005 |

* cited by examiner

*Primary Examiner* — S. V Clark
(74) *Attorney, Agent, or Firm* — Oblon, Spivak, McClelland, Maier & Neustadt, L.L.P.

(57) ABSTRACT

A semiconductor device includes a substrate; and a chip formed on the substrate and electrically connected to the substrate by a wire. The chip includes a wiring layer electrically connected to the wire; and a protective layer formed on the wiring layer. The wiring layer includes a wiring portion having the protective layer formed in an upper layer thereof and being electrically connected to another layer at a lower layer thereof; a bonding portion connected to one end of the wire at an exposed surface thereof, the exposed surface not having the protective layer formed in an upper layer thereof; and a connecting portion configured to join the wiring portion and the bonding portion. The connecting portion includes an etched portion formed by digging out the wiring layer.

22 Claims, 10 Drawing Sheets cross-sectional view taken along line A-A'

US 8,044,522 B2

SEMICONDUCTOR DEVICE

CROSS REFERENCE TO RELATED APPLICATIONS

This application is based upon and claims the benefit of priority from the prior Japanese Patent Application No. 2008-283128, filed on Nov. 4, 2008, the entire contents of which are incorporated herein by reference.

BACKGROUND OF THE INVENTION

1. Field of the Invention

The present invention relates to a semiconductor device configured to be electrically connectable to an external electrode by a wire.

2. Description of the Related Art

Conventionally, there are various technologies for electrically connecting a semiconductor chip to an external electrode. A semiconductor chip utilizing this kind of technology includes a bonding pad. The bonding pad is used for connecting one end of a wire to an upper portion thereof. Note that the other end of the wire is connected to the external electrode.

When the wire is connected, a physical impact is applied to the bonding pad, and there is a risk that the bonding pad is damaged due to this impact. That is to say, there is a risk that a connection error occurs. A semiconductor device configured to deal with this kind of problem is disclosed in patent document 1 (Japanese Unexamined Patent Application Publication No. 03-227540) and patent document 2 (Japanese Unexamined Patent Application Publication No. 2005-223172).

However, it is difficult to solve the above-described problem sufficiently even using the semiconductor devices disclosed in patent documents 1 and 2.

SUMMARY OF THE INVENTION

A semiconductor device in accordance with an aspect of the present invention includes: a substrate; and a chip formed on the substrate and electrically connected to the substrate by a wire, the chip including: a wiring layer electrically connected to the wire; and a protective layer formed on the wiring layer, the wiring layer including: a wiring portion having the protective layer formed in an upper layer thereof and being electrically connected to another layer at a lower layer thereof; a bonding portion connected to one end of the wire at an exposed surface thereof, the exposed surface not having the protective layer formed in an upper layer thereof; and a connecting portion configured to join the wiring portion and the bonding portion, the connecting portion including: an etched portion formed by digging out the wiring layer.

DETAILED DESCRIPTION OF THE EMBODIMENTS

Embodiments of a semiconductor device in accordance with the present invention are now described with reference to the drawings.

First Embodiment

Figure 1:
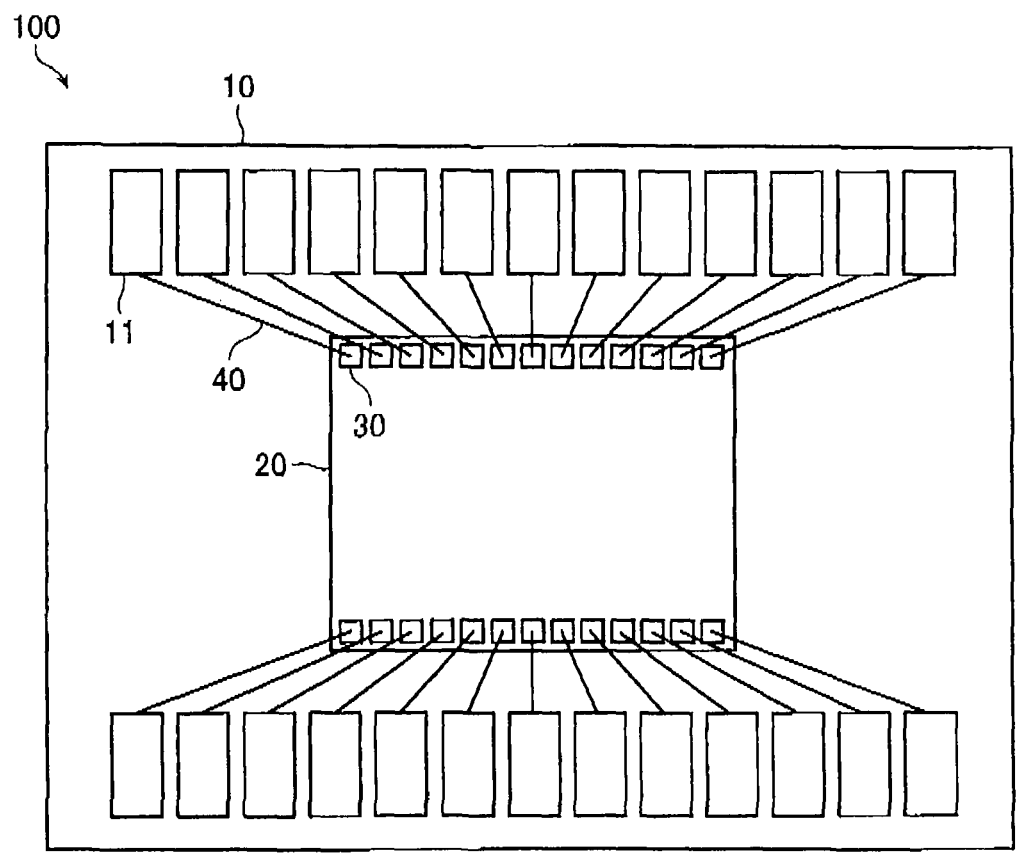
FIG. 1 is a top view of a semiconductor device 100 in accordance with a first embodiment of the present invention.
Figure 2:
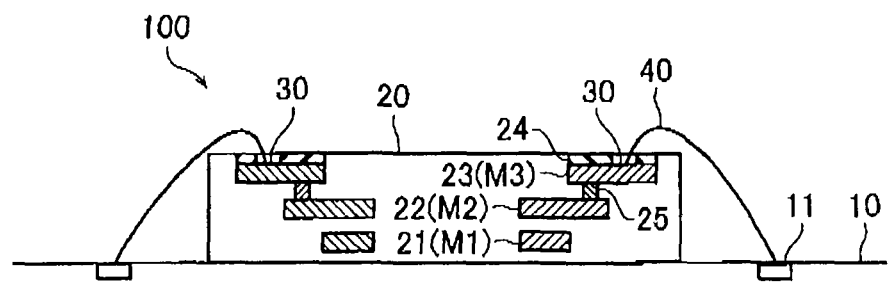
FIG. 2 is a side view of the semiconductor device 100 in accordance with the first embodiment.

Configuration of a Semiconductor Device 100 in Accordance with a First Embodiment FIG. 1 shows a top view of a semiconductor device 100 in accordance with a first embodiment of the present invention, and FIG. 2 shows a side view thereof. As shown in FIGS. 1 and 2, the semiconductor device 100 in accordance with the first embodiment includes a substrate 10 and a semiconductor chip 20. Provided with a certain spacing in the substrate 10 are a plurality of electrodes 11 electrically connected to interconnection (not shown). Provided with a certain spacing in the semiconductor chip 20 at both edges thereof are a plurality of bonding pads 30. Connected to the bonding pads 30 is one end of a wire 40. Another end of the wire 40 is connected to the electrodes 11.

The chip 20 includes a first wiring layer 21 (M1), a second wiring layer 22 (M2), a third wiring layer 23 (a fourth and fifth wiring layers 231 and 232 in FIG. 3) (M3), a protective layer 24, and a plug layer 25, as shown in FIG. 2. Here, the symbol "M1" signifies a lowermost layer, signal "M3" signifies an uppermost layer, and symbol "M2" signifies an intermediate layer between "M1" and "M3". The protective layer 24 is formed in a surface of the third wiring layer 23 and protects the third wiring layer 23. Portions of the third wiring layer 23 where the protective layer 24 is stripped away function as the bonding pads 30. The plug layer 25 electrically connects between the second wiring layer 22 and the third wiring layer 23.

Figure 3:
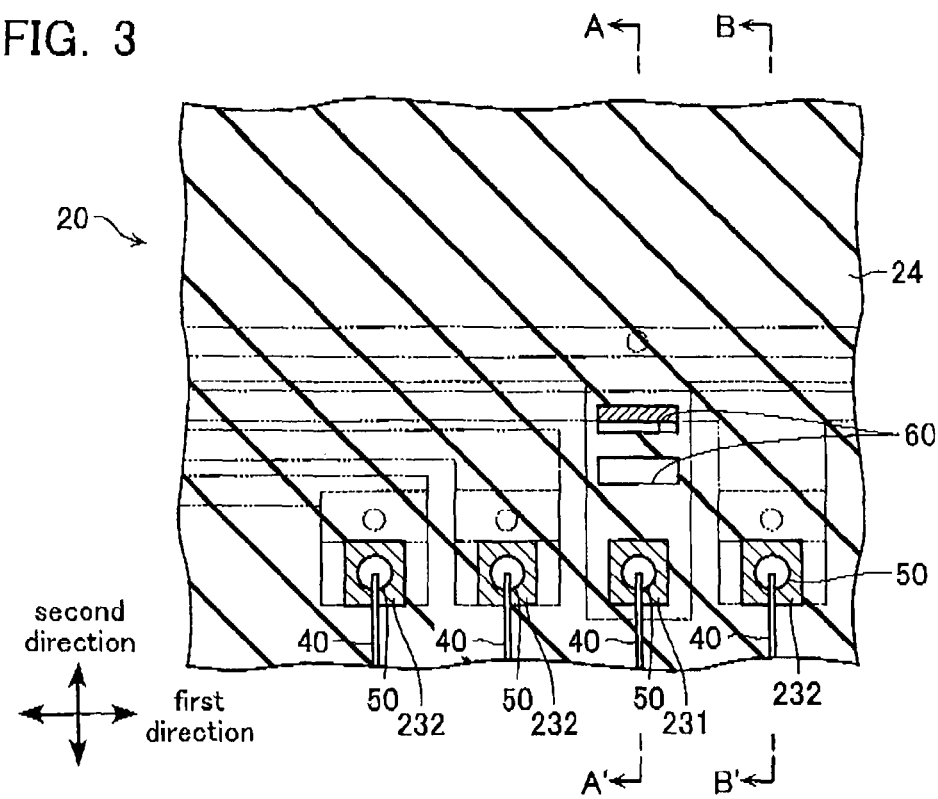
FIG. 3 is a top view of a semiconductor chip 20 in accordance with the first embodiment.
Figure 4:
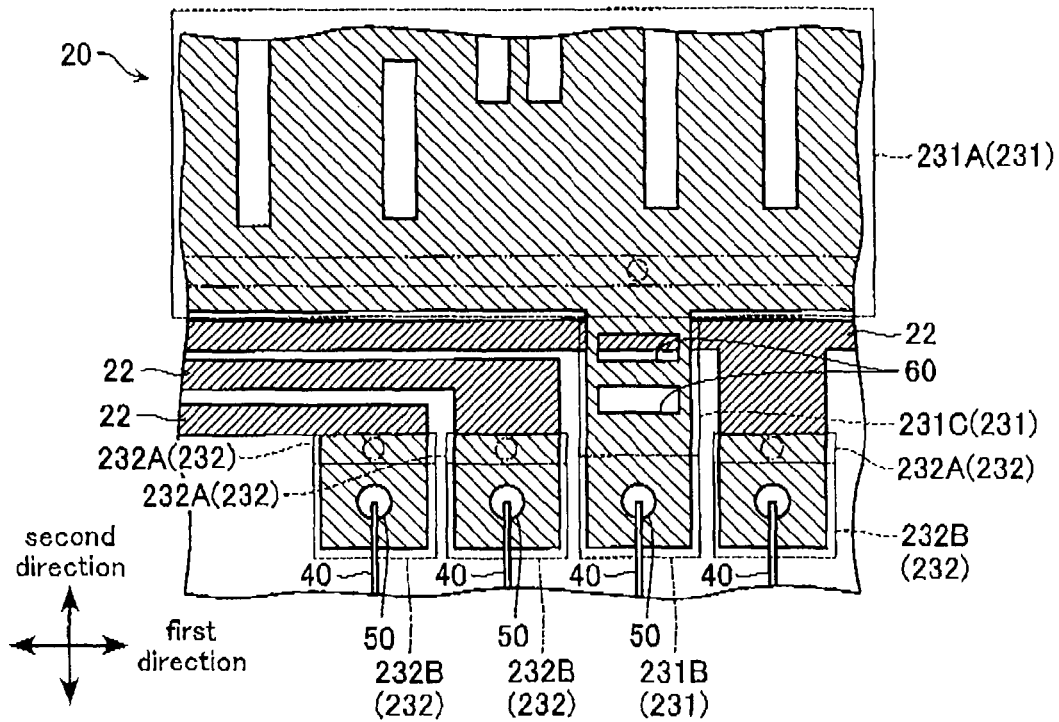
FIG. 4 is a view of FIG. 3 having a protective layer 24 omitted therefrom.
Figure 5:
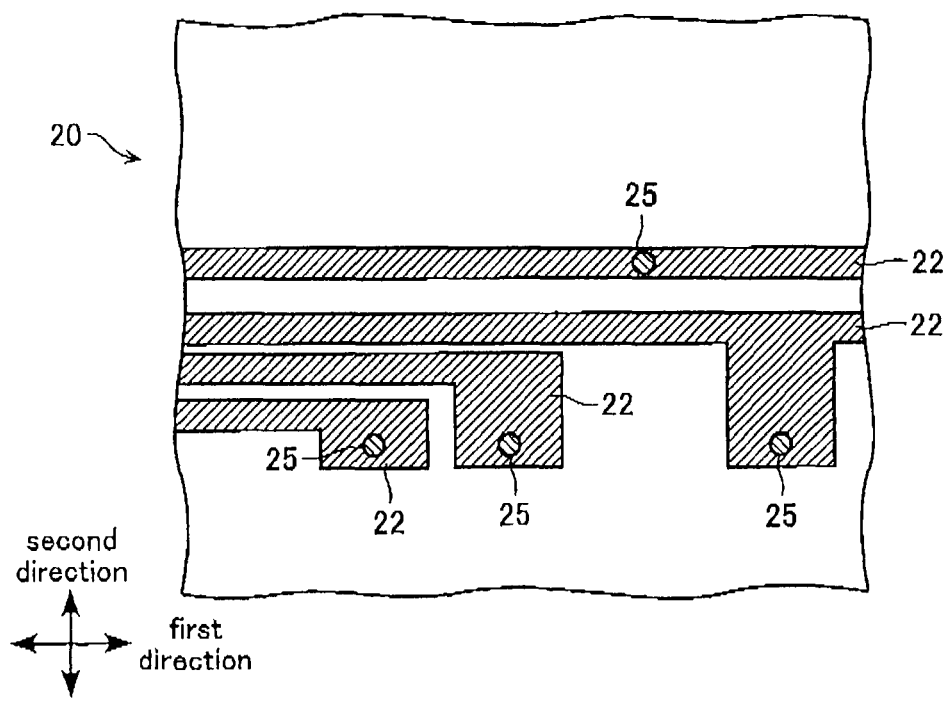
FIG. 5 is a view of FIG. 4 having a third wiring layer 23 omitted therefrom.
Figure 6:
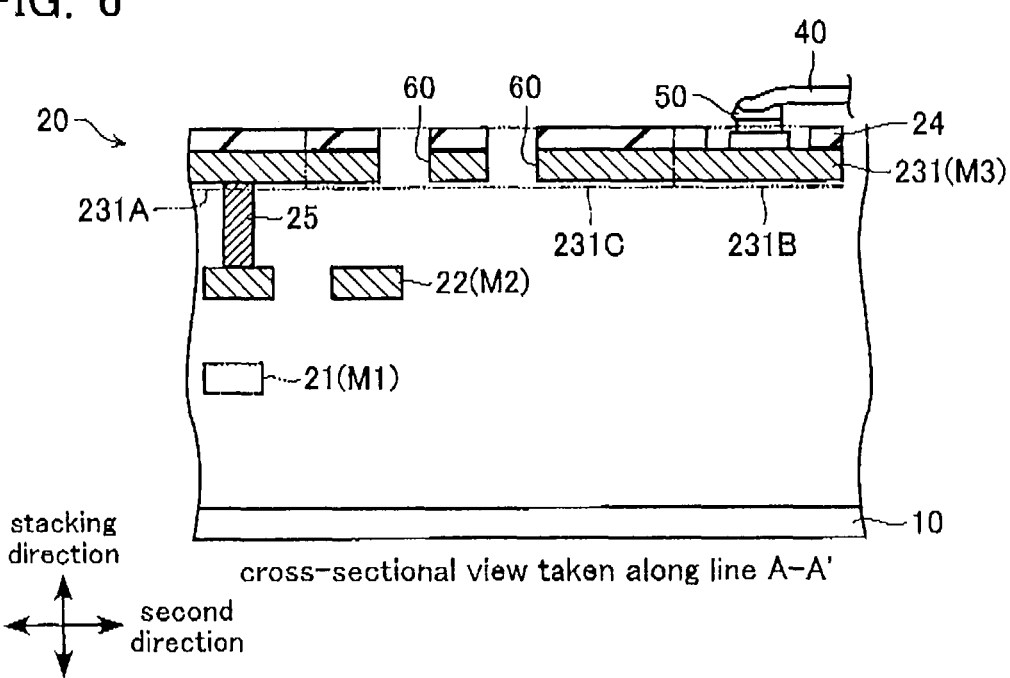
FIG. 6 is a cross-sectional view taken along a line A-A' in FIG. 3.
Figure 7:
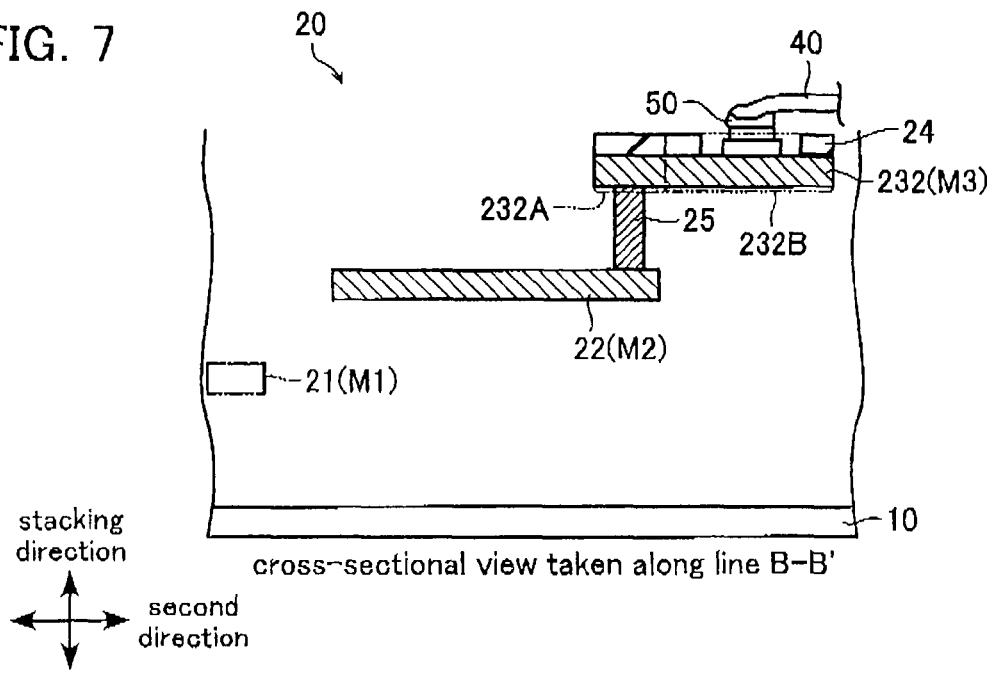
FIG. 7 is a cross-sectional view taken along a line B—B' in FIG. 3.

Next, a specific configuration of the semiconductor chip 20 is described with reference to FIGS. 3~7. FIG. 3 is a top view of the semiconductor chip 20. FIG. 4 is a view of FIG. 3 having the protective layer 24 omitted therefrom. FIG. 5 is a view of FIG. 4 having the third wiring layer 23 omitted therefrom. FIG. 6 is a cross-sectional view taken along a line A-A' in FIG. 3. FIG. 7 is a cross-sectional view taken along a line B-B' in FIG. 3. There are, for example, interlayer insulating layers formed between the first through third wiring layers 21~23. However, the interlayer insulating layers are omitted from marking on FIGS. 3~7.

As shown in FIGS. 3~7 and similarly to the foregoing description of FIG. 2, the semiconductor chip 20 includes sequentially from a lower layer the first wiring layer 21, the second wiring layer 22, the third wiring layer 23, and the protective layer 24, with interlayer insulating layers interposed therebetween. The plug layer 25 is formed between the second wiring layer 22 and the third wiring layer 23. The second wiring layer 22 and the third wiring layer 23 are electrically connected via the plug layer 25.

The third wiring layer 23 is configured by the fourth wiring layer 231 and the fifth wiring layer 232 formed in a same layer as the fourth wiring layer 231, as shown in FIG. 4. The fourth wiring layer 231 is flowed a large current as a ground voltage Vss or the like, and therefore has a width which is broader than that of the fifth wiring layer 232. The fifth wiring layer 232 is flowed a small current compared to the fourth wiring layer 231, and therefore has a width which is narrower than that of the fourth wiring layer 231. Here, "width" is a width with respect to a direction of a current flow, and "broad" means that at least one portion of wiring is broad.

The fourth wiring layer 231 includes a wiring portion 231A, a bonding portion 231B provided at an extremity projecting from the wiring portion 231A in a second direction, and a connecting portion 231C configured to join the wiring portion 231A and the bonding portion 231B, as shown in FIGS. 4 and 6. Here, the wiring portion 231A, the bonding portion 231B, and the connecting portion 231C are formed continuously in an integrated manner. The bonding portion 231B and the connecting portion 231C are located at an edge of the semiconductor chip 20. Note that a stacking direction is a direction in which various layers are stacked during manufacture. A first direction is a direction orthogonal to the stacking direction. The second direction is a direction orthogonal to the stacking direction and the first direction.

The wiring portion 231A is electrically connected in a lower layer thereof to the second wiring layer 22 via the plug layer 25, as shown in FIGS. 4~6. An upper surface of the wiring portion 231A is covered by the protective layer 24.

As shown in FIGS. 3 and 6, an upper surface of the bonding portion 231B is not covered by the protective layer 24. That is to say, a surface of the bonding portion 231B is exposed, and in a state of being electrically connectable to the one end of the wire 40. Formed on the upper surface of the bonding portion 231B is a wire bump 50. The wire bump 50 is for electrically connecting the one end of the wire 40 to the bonding portion 231B. The bonding portion 231B has a ground voltage applied thereto.

The connecting portion 231C includes etched portions 60 formed by digging out the fourth wiring layer 231, as shown in FIGS. 3, 4 and 6. The etched portion 60 is configured by a slit (a through hole) formed so as to penetrate the fourth wiring layer 231. An upper surface of the connecting portion 231C excluding the etched portions 60 is covered by the protective layer 24. The etched portion (slit) 60 is formed in a rectangular shape extending in the first direction. The etched portions (slits) 60 are formed so as to be lined up with a certain pitch in the second direction.

The fifth wiring layer 232 is formed in a substantially rectangular shape as viewed from above, as shown in FIG. 4. The fifth wiring layers 232 are formed with a certain spacing in the first direction along the wiring portion 231A of the fourth wiring layer 231. As shown in FIGS. 4 and 7, the fifth wiring layer 232 includes a wiring portion 232A, and a bonding portion 232B provided adjacent to the wiring portion 232A.

The wiring portion 232A is provided on one side in the second direction of the fifth wiring layer 232, as shown in FIGS. 4 and 7. A lower surface of the wiring portion 232A is electrically connected to the second wiring layer 22 via the plug layer 25, as shown in FIG. 7.

The bonding portion 232B is formed on another side in the second direction of the fifth wiring layer 232, as shown in FIGS. 4 and 7. An upper surface of the bonding portion 232B is not covered by the protective layer 24, as shown in FIGS. 3 and 7. That is to say, a surface of the bonding portion 232B is exposed. Formed on the surface of the bonding portion 232B is the wire bump 50. The bonding portion 232E serves as a part of the aforementioned bonding pads 30.

The first through third wiring layers 21~23 are constituted by, for example, aluminum (Al). The protective layer 24 and the interlayer insulating layers (not shown) are constituted by, for example, silicon oxide ($SiO_2$). The plug layer 25 is constituted by, for example, tungsten (W). The wire bump 50 is constituted by, for example, gold (Au).

(Method for Attaching in the Semiconductor Device 100 in Accordance with the First Embodiment)

Figure 8:
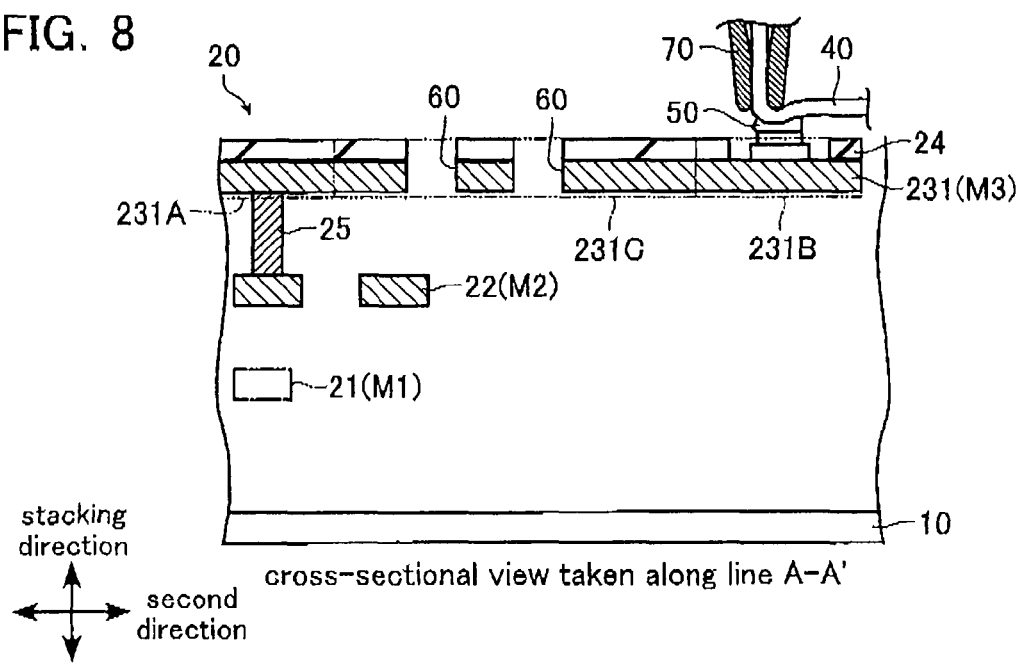
FIG. 8 is a view describing a method for attaching a wire 40 of the semiconductor device 100.

Next, a method for attaching the wire 40 in the semiconductor device 100 is described with reference to FIG. 8. As shown in FIG. 8, in the semiconductor device in accordance with the first embodiment, the wire 40 is pressed on to the wire bump 50 by a capillary 70 and thereby attached to the wire bump 50. As a result, during a contact of the wire 40 with the wire bump 50, a vibration (resonance) occurs in an entirety of the third wiring layer 23.

(Advantage of the Semiconductor Device 100 in Accordance with the First Embodiment)

Next, an advantage of the semiconductor device 100 in accordance with the first embodiment is described. In order to describe the advantage of the first embodiment, a comparative example is here considered. The comparative example has a configuration substantially similar to that of the first embodiment. The comparative example differs from the first embodiment in not having the etched portions (slits) 60.

In the comparative example, the vibration (resonance) during attaching of the wire 40 causes the entire fourth wiring layer 231 (the wiring portion 231A, the bonding portion 231B, and the connecting portion 231C) to be greatly shaken. As a result, in the comparative example, damage occurs in the bonding portion 231B and the connecting portion 231C of the fourth wiring layer 231.

By contrast, the semiconductor device 100 in accordance with the first embodiment includes the etched portions (slits) 60 formed so as to dig out the third wiring layer 23 in the connecting portion 231C. Consequently, in the semiconductor device 100 in accordance with the first embodiment, an effect of the vibration (resonance) during attaching of the wire 40 can be suppressed by the etched portions (slits) 60. That is to say, in the semiconductor device 100 in accordance with the first embodiment, an intrinsic vibration frequency leading to resonance in the fourth wiring layer 231 of the third wiring layer 23 can be controlled. As a result, in the first embodiment, damage in the bonding portion 231B and the connecting portion 231C of the fourth wiring layer 231 can be suppressed and faulty connection can be reduced.

Second Embodiment

Figure 9:
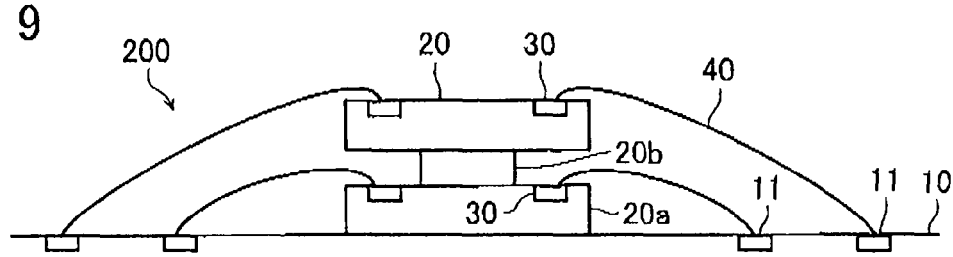
FIG. 9 is a side view of a semiconductor device 200 in accordance with a second embodiment of the present invention.

Configuration of a Semiconductor Device 200 in Accordance with a Second Embodiment Next, a configuration of a semiconductor device 200 in accordance with a second embodiment is described with reference to FIG. 9. FIG. 9 is a side view of the semiconductor device 200 in accordance with the second embodiment. Note that in the second embodiment, identical symbols are assigned to configurations similar to those in the first embodiment and descriptions thereof are omitted.

As shown in FIG. 9, the semiconductor device 200 in accordance with the second embodiment includes the substrate 10 and the semiconductor chip 20, similarly to the first embodiment. Further included below the semiconductor chip 20 of the semiconductor device 200 in accordance with the second embodiment are a spacer chip 20b and a semiconductor chip 20a. The semiconductor chip 20 is stacked so as to overlap the semiconductor chip 20a with the spacer chip 20b interposed therebetween. The semiconductor chip 20a has a configuration similar to that of the semiconductor chip 20. An occupied area of the spacer chip 20b is smaller than that of the semiconductor chips 20 and 20a. The spacer chip 20b is provided on the semiconductor chip 20a, avoiding a region positioned above (below) the bonding pads 30. That is to say, below the bonding pads 30 in the semiconductor chip 20 is not supported by the spacer chip 20b, and is in a state of having a gap with the semiconductor chip 20a.

It is necessary here to connect the wire 40 to the bonding pads 30 of the semiconductor chip 20a. For example, if the semiconductor chip 20 is simply stacked on the semiconductor chip 20a, the wire 40 connected to the lower layer semiconductor chip 20a comes into contact with the upper layer semiconductor chip 20. Thus, in the second embodiment, the spacer chip 20b is stacked on the semiconductor chip 20a to secure a space between the semiconductor chip 20 and the wire 40.

(Advantage of the Semiconductor Device 200 in Accordance with the Second Embodiment)

Next, an advantage of the semiconductor device 200 in accordance with the second embodiment is described. The semiconductor device 200 in accordance with the second embodiment has a similar configuration to that of the first embodiment. Consequently, the semiconductor device 200 in accordance with the second embodiment has the same advantages as that of the first embodiment. The semiconductor device 200 in accordance with the second embodiment further includes a configuration in which the semiconductor chips 20 and 20a are stacked. Consequently, in the semiconductor device 200 in accordance with the second embodiment, an occupied area thereof can be made smaller than in the first embodiment.

Moreover, there is the gap opened below the bonding pads 30 in the upper layer semiconductor chip 20, and the effect of the vibration (resonance) during attaching of the wire 40 is increased. However, since the connecting portion 231C includes the etched portions (slits) 60 formed so as to dig out the third wiring layer 23, the effect of the vibration (resonance) during attaching of the wire 40 can be suppressed and faulty connection can be reduced.

Third Embodiment

Figure 10A:
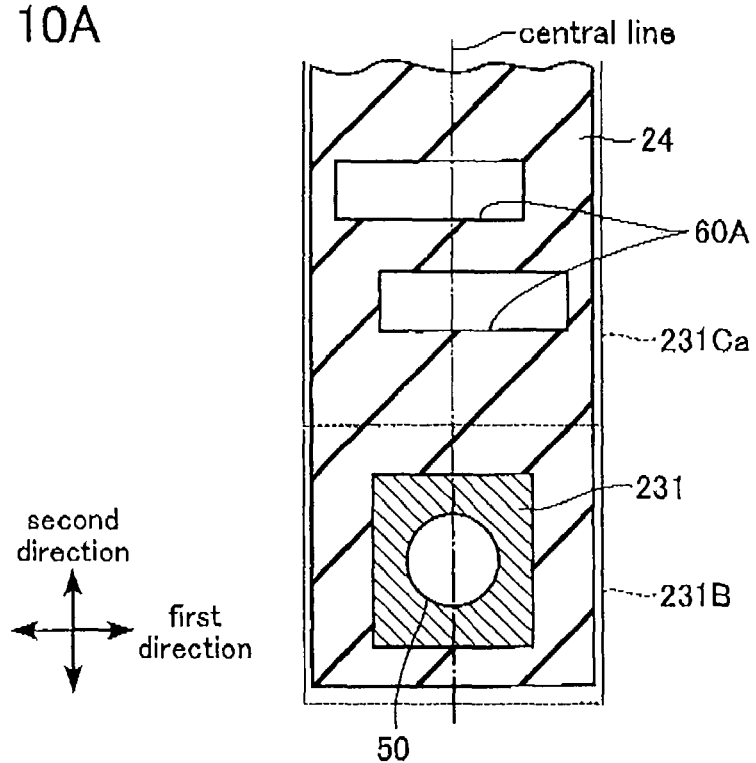
FIG. 10A is an enlarged top view of a semiconductor chip in a semiconductor device in accordance with a third embodiment of the present invention.

Next, a configuration of a semiconductor device in accordance with a third embodiment is described with reference to FIG. 10A. FIG. 10A is an enlarged top view of the semiconductor chip in the semiconductor device in accordance with the third embodiment. As shown in FIG. 10A, the semiconductor device in accordance with the third embodiment includes a connecting portion 231Ca that differs from the first and second embodiments. Note that in the third embodiment, identical symbols are assigned to configurations similar to those in the first and second embodiments and descriptions thereof are omitted.

The connecting portion 231Ca includes etched portions 60A having a different shape to the first and second embodiments, as shown in FIG. 10A. The etched portion 60A is formed in a slit shape so as to penetrate the fourth wiring layer 231. An upper surface of the connecting portion 231Ca, excluding the etched portions 60A, is covered by the protective layer 24. The etched portion (slit) 60A is formed in a rectangular shape extending in the first direction. The etched portions (slits) 60A lined up in the second direction are formed so as to be alternately misaligned from a central line of the connecting portion 231Ca in the first direction.

The semiconductor device in accordance with the third embodiment has a substantially similar configuration to that of the first embodiment, and therefore has the same advantages as that of the first embodiment.

Fourth Embodiment

Figure 10B:
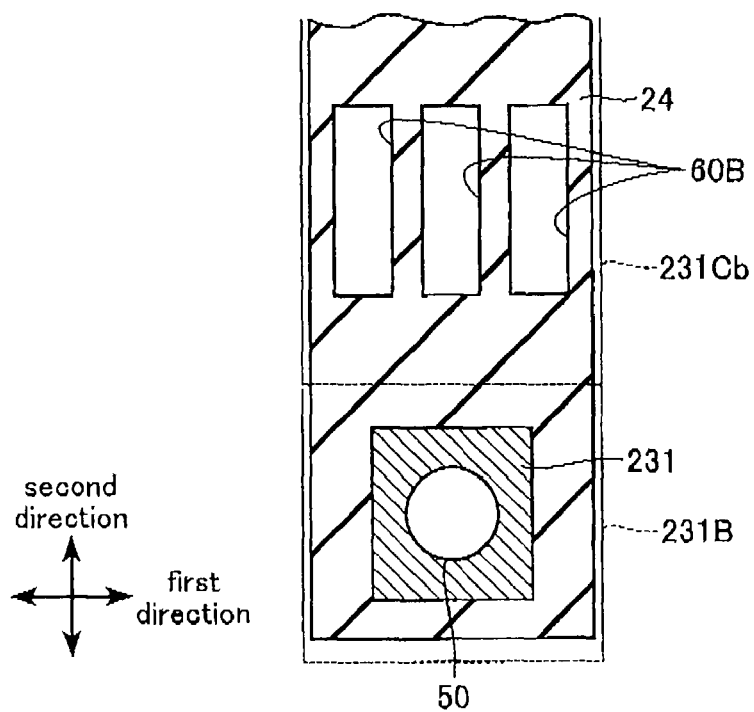
FIG. 10B is an enlarged top view of a semiconductor chip in a semiconductor device in accordance with a fourth embodiment of the present invention.

Next, a configuration of a semiconductor device in accordance with a fourth embodiment is described with reference to FIG. 10B. FIG. 10B is an enlarged top view of the semiconductor chip in the semiconductor device in accordance with the fourth embodiment. As shown in FIG. 10B, the semiconductor device in accordance with the fourth embodiment includes a connecting portion 231Cb that differs from the first through third embodiments. Note that in the fourth embodiment, identical symbols are assigned to configurations similar to those in the first through third embodiments and descriptions thereof are omitted.

The connecting portion 231Cb includes etched portions 60B that differ from the first through third embodiments, as shown in FIG. 10B. The etched portion 60B is configured by a slit (a through hole) formed so as to penetrate the fourth wiring layer 231. An upper surface of the connecting portion 231Cb, excluding the etched portions 60B, is covered by the protective layer 24. The etched portion (slit) 60B is formed in a rectangular shape extending in the second direction. The etched portions (slits) 60B are formed lined up in the first direction.

The semiconductor device in accordance with the fourth embodiment has a substantially similar configuration to that of the first embodiment, and therefore has the same advantages as that of the first embodiment.

Fifth Embodiment

Figure 10C:
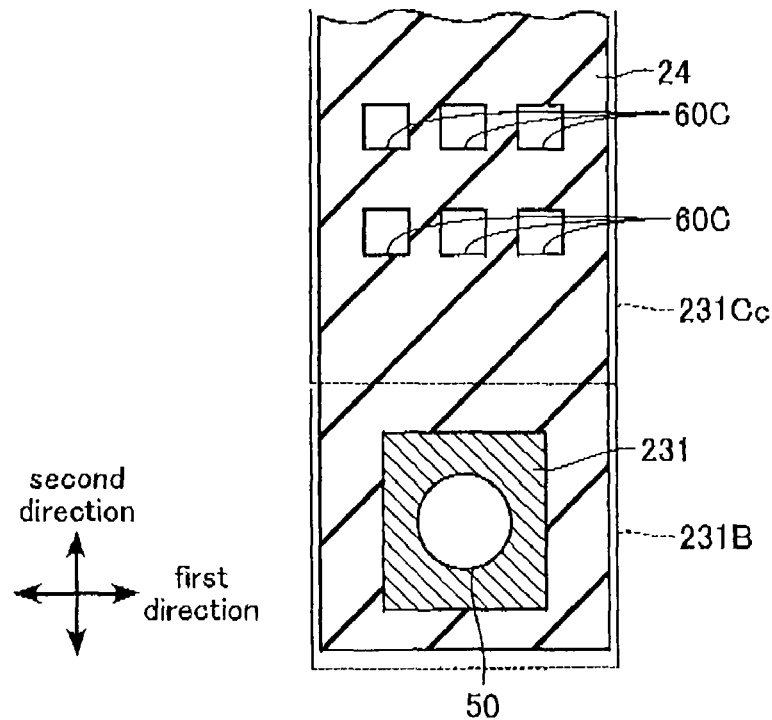
FIG. 10C is an enlarged top view of a semiconductor chip in a semiconductor device in accordance with a fifth embodiment of the present invention.

Next, a configuration of a semiconductor device in accordance with a fifth embodiment is described with reference to FIG. 10C. FIG. 10C is an enlarged top view of the semiconductor chip in the semiconductor device in accordance with the fifth embodiment. As shown in FIG. 10C, the semiconductor device in accordance with the fifth embodiment includes a connecting portion 231Cc that differs from the first through fourth embodiments. Note that in the fifth embodiment, identical symbols are assigned to configurations similar to those in the first through fourth embodiments and descriptions thereof are omitted.

The connecting portion 231Cc includes etched portions 60C that differ from the first through fourth embodiments, as shown in FIG. 10O. The etched portion 60C is configured by a slit (a through hole) formed so as to penetrate the fourth wiring layer 231. An upper surface of the connecting portion 231Cc, excluding the etched portions 60C, is covered by the protective layer 24. The etched portion (slit) 60C is formed in a square shape. The etched portions (slits) 60C are formed so as to be positioned in a matrix formation in the first direction and in the second direction.

The semiconductor device in accordance with the fifth embodiment has a substantially similar configuration to that of the first embodiment, and therefore has the same advantages as that of the first embodiment.

Sixth Embodiment

Figure 10D:
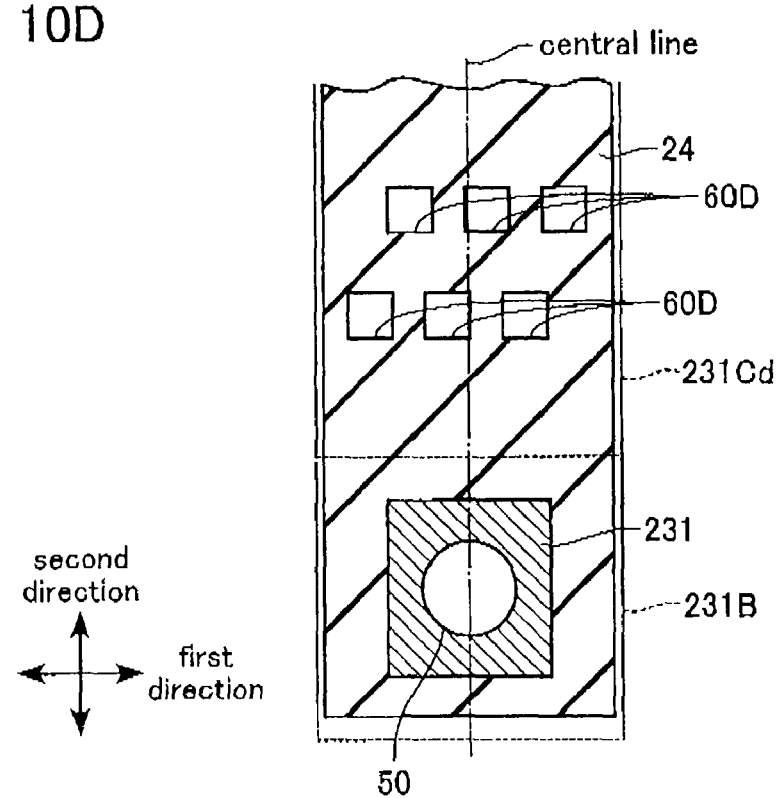
FIG. 10D is an enlarged top view of a semiconductor chip in a semiconductor device in accordance with a sixth embodiment of the present invention.

Next, a configuration of a semiconductor device in accordance with a sixth embodiment is described with reference to FIG. 10D. FIG. 10D is an enlarged top view of the semiconductor chip in the semiconductor device in accordance with the sixth embodiment. As shown in FIG. 10D, the semiconductor device in accordance with the sixth embodiment includes a connecting portion 231Cd that differs from the first through fifth embodiments. Note that in the sixth embodiment, identical symbols are assigned to configurations similar to those in the first through fifth embodiments and descriptions thereof are omitted.

The connecting portion 231Cd includes etched portions (slits) 60D configured in a similar shape to the fifth embodiment, as shown in FIG. 10D. The etched portions (slits) 60D are formed so as to be lined up in the first direction and in the second direction. The etched portions (slits) 60D lined up in the second direction are formed so as to be alternately misaligned from the central line of the connecting portion 231Cd in the first direction.

The semiconductor device in accordance with the sixth embodiment has a substantially similar configuration to that of the first embodiment, and therefore has the same advantages as that of the first embodiment.

Seventh Embodiment

Figure 10E:
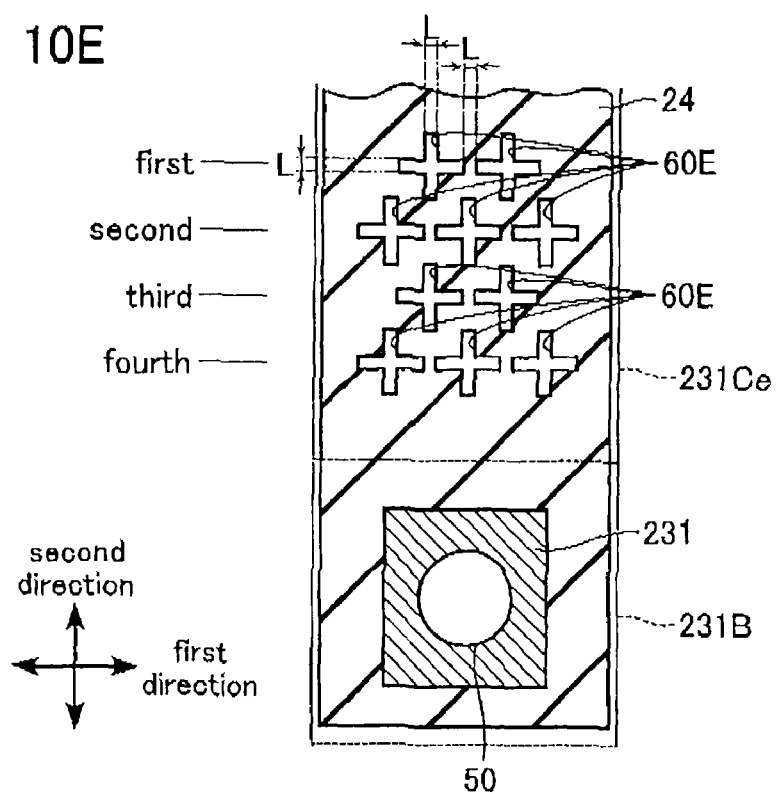
FIG. 10E is an enlarged top view of a semiconductor chip in a semiconductor device in accordance with a seventh embodiment of the present invention.

Next, a configuration of a semiconductor device in accordance with a seventh embodiment is described with reference to FIG. 10E. FIG. 10E is an enlarged top view of the semiconductor chip in the semiconductor device in accordance with the seventh embodiment. As shown in FIG. 10E, the semiconductor device in accordance with the seventh embodiment includes a connecting portion 231Ce that differs from the first through sixth embodiments. Note that in the seventh embodiment, identical symbols are assigned to configurations similar to those in the first through sixth embodiments and descriptions thereof are omitted.

The connecting portion 231Ce includes etched portions 60E that differ from the first through sixth embodiments, as shown in FIG. 10E. The etched portion 60E is configured by a slit (a through hole) formed so as to penetrate the fourth wiring layer 231. An upper surface of the connecting portion 231Ce, excluding the etched portions 60E, is covered by the protective layer 24. The etched portion (slit) 60E is configured in a cross shape extending in the first direction and the second direction. The slit 60E has a width of a certain length L. There are, for example, two slits 60E provided at a (2n−1)th (for example, first, third) position in the second direction (where n is an integer greater than or equal to 1), and three slits 60E provided at a (2n)th (for example, second, fourth) position in the second direction. An extremity in the second direction of the two (2n−1)th slits 60E is formed so as to be aligned with an extremity in the second direction of the three (2n)th slits 60E. The two (2n−1)th slits 60E and the three (2n)th slits 60E are formed separated by a spacing of the certain length L in the first direction. A center of a (2n)th slit 60E is positioned at a center in the first direction of a line segment joining centers of two (2n−1)th slits 60E.

The semiconductor device in accordance with the seventh embodiment has a substantially similar configuration to that of the first embodiment, and therefore has the same advantages as that of the first embodiment.

Eighth Embodiment

Figure 10F:
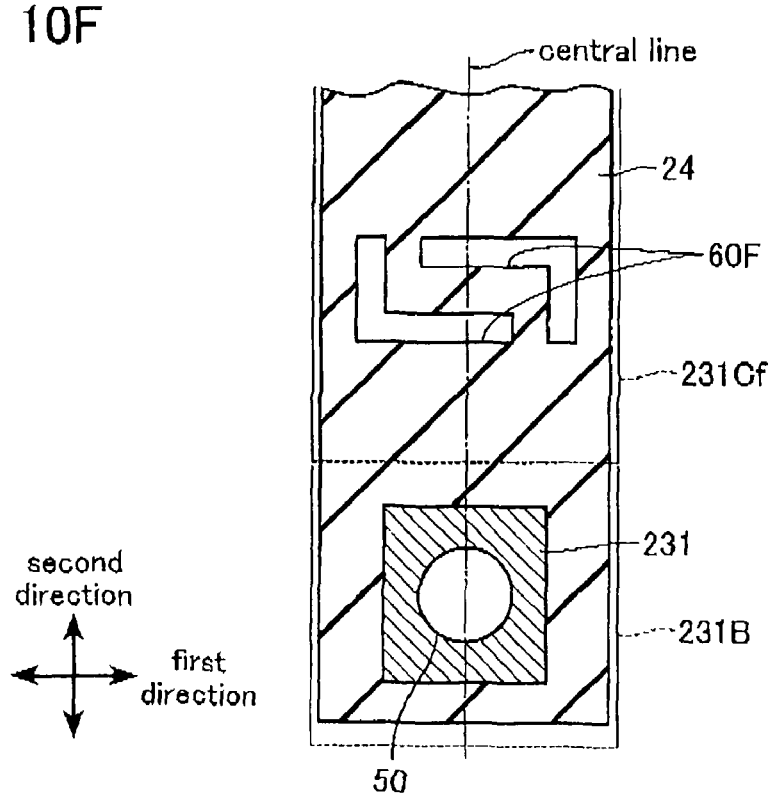
FIG. 10F is an enlarged top view of a semiconductor chip in a semiconductor device in accordance with an eighth embodiment of the present invention.

Next, a configuration of a semiconductor device in accordance with an eighth embodiment is described with reference to FIG. 10F. FIG. 10F is an enlarged top view of the semiconductor chip in the semiconductor device in accordance with the eighth embodiment. As shown in FIG. 10F, the semiconductor device in accordance with the eighth embodiment includes a connecting portion 231Cf that differs from the first through seventh embodiments. Note that in the eighth embodiment, identical symbols are assigned to configurations similar to those in the first through seventh embodiments and descriptions thereof are omitted.

The connecting portion 231Cf includes etched portions 60F that differ from the first through seventh embodiments, as shown in FIG. 10F. The etched portion 60F is configured by a slit (a through hole) formed so as to penetrate the fourth wiring layer 231. An upper surface of the connecting portion 231Cf, excluding the etched portions 60F, is covered by the protective layer 24. The etched portion (slit) 60F is configured in an L shape. A pair of the etched portions (slits) 60F is formed so as to oppose each other. One of the etched portions (slits) 60F has a shape that is the other of the etched portions (slits) 60F rotated 180° in a certain plane (a plane configured by the first direction and the second direction). The pair of etched portions (slits) 60F is formed so as to be alternately misaligned from a central line of the connecting portion 231Cf in the first direction.

The semiconductor device in accordance with the eighth embodiment has a substantially similar configuration to that of the first embodiment, and therefore has the same advantages as that of the first embodiment.

Ninth Embodiment

Figure 10G:
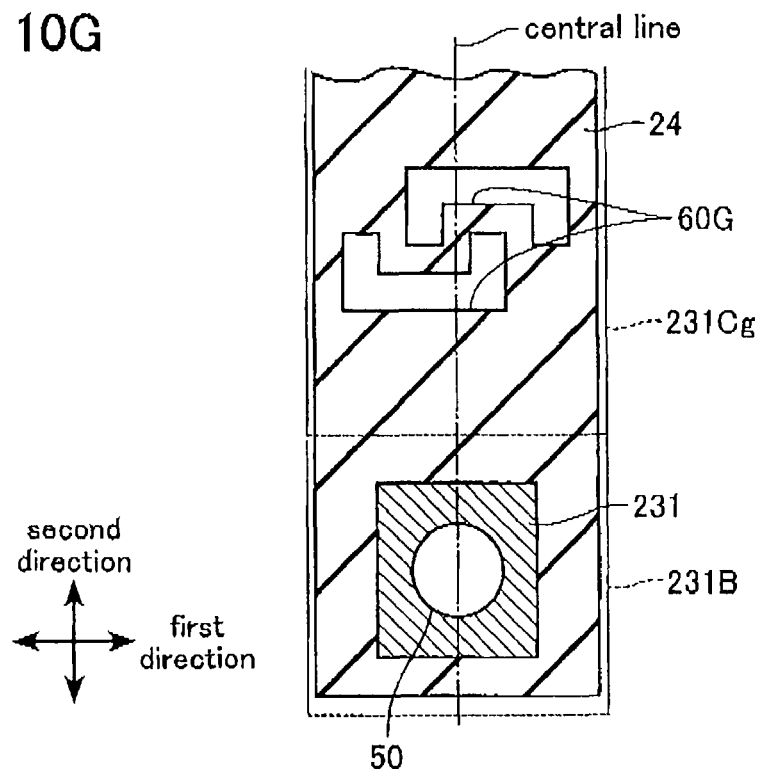
FIG. 10G is an enlarged top view of a semiconductor chip in a semiconductor device in accordance with a ninth embodiment of the present invention.

Next, a configuration of a semiconductor device in accordance with a ninth embodiment is described with reference to FIG. 10G. FIG. 10G is an enlarged top view of the semiconductor chip in the semiconductor device in accordance with the ninth embodiment. As shown in FIG. 10G, the semiconductor device in accordance with the ninth embodiment includes a connecting portion 231Cg that differs from the first through eighth embodiments. Note that in the ninth embodiment, identical symbols are assigned to configurations similar to those in the first through eighth embodiments and descriptions thereof are omitted.

The connecting portion 231Cg includes etched portions 60G that differ from the first through eighth embodiments, as shown in FIG. 10G. The etched portion 60G is configured by a slit (a through hole) formed so as to penetrate the fourth wiring layer 231. An upper surface of the connecting portion 231Cg, excluding the etched portions 60G, is covered by the protective layer 24. The etched portion (slit) 60G is configured in a U shape. A pair of the etched portions (slits) 60G is formed so as to be misaligned in the first direction and opposing each other in the second direction. One of the etched portions (slits) 60G has a shape that is the other of the etched portions (slits) 60G rotated 180° in the certain plane (the plane configured by the first direction and the second direction). The pair of etched portions (slits) 60G is formed so as to be alternately misaligned from a central line of the connecting portion 231Cg in the first direction.

The semiconductor device in accordance with the ninth embodiment has a substantially similar configuration to that of the first embodiment, and therefore has the same advantages as that of the first embodiment.

Tenth Embodiment

Figure 10H:
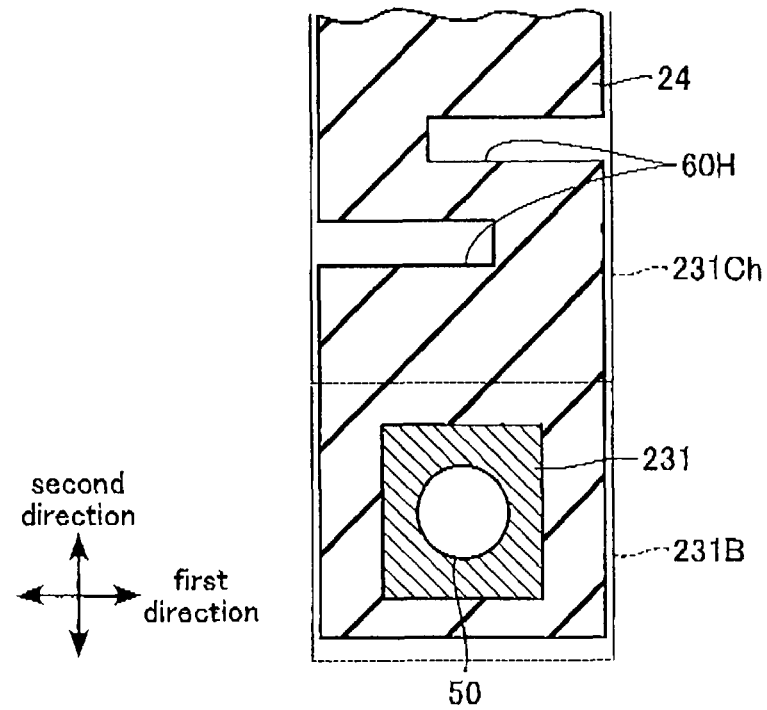
FIG. 10H is an enlarged top view of a semiconductor chip in a semiconductor device in accordance with a tenth embodiment of the present invention.

Next, a configuration of a semiconductor device in accordance with a tenth embodiment is described with reference to FIG. 10H. FIG. 10H is an enlarged top view of the semiconductor chip in the semiconductor device in accordance with the tenth embodiment. As shown in FIG. 10H, the semiconductor device in accordance with the tenth embodiment includes a connecting portion 231Ch that differs from the first through ninth embodiments. Note that in the tenth embodiment, identical symbols are assigned to configurations similar to those in the first through ninth embodiments and descriptions thereof are omitted.

The connecting portion 231Ch includes etched portions 60H that differ from the first through ninth embodiments, as shown in FIG. 10H. The etched portion 60H is configured by a slit (a through hole) formed so as to penetrate the fourth wiring layer 231. An upper surface of the connecting portion 231Ch, excluding the etched portions 60H, is covered by the protective layer 24. The etched portion (slit) 60H has a shape extending from one edge in the first direction towards a center in the first direction. There are, for example, two etched portions (slits) 60H provided in the second direction. One of the etched portions (slits) 60H is formed at a first position in the second direction so as to extend from one end in the first direction. The other of the etched portions (slits) 60H is formed at a second position in the second direction so as to extend from the other edge in the first direction.

The semiconductor device in accordance with the tenth embodiment has a substantially similar configuration to that of the first embodiment, and therefore has the same advantages as that of the first embodiment.

Eleventh Embodiment

Figure 11A:
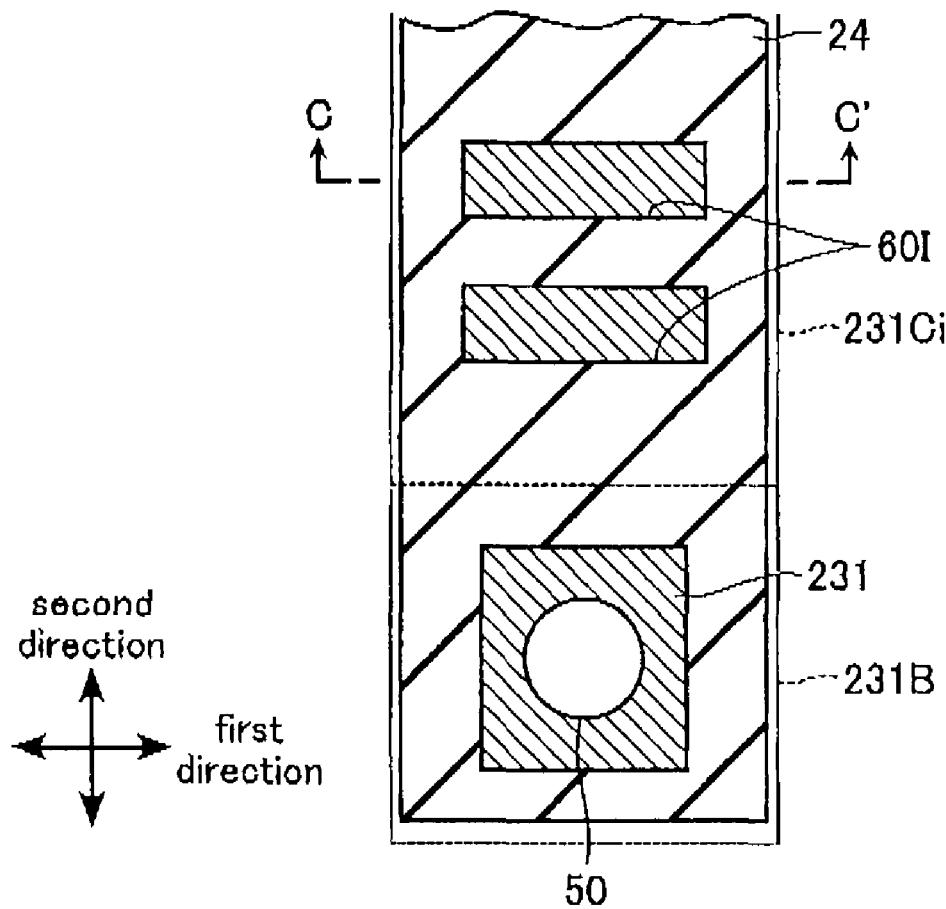
FIG. 11A is an enlarged top view of a semiconductor chip in a semiconductor device in accordance with an eleventh embodiment of the present invention.
Figure 11B:
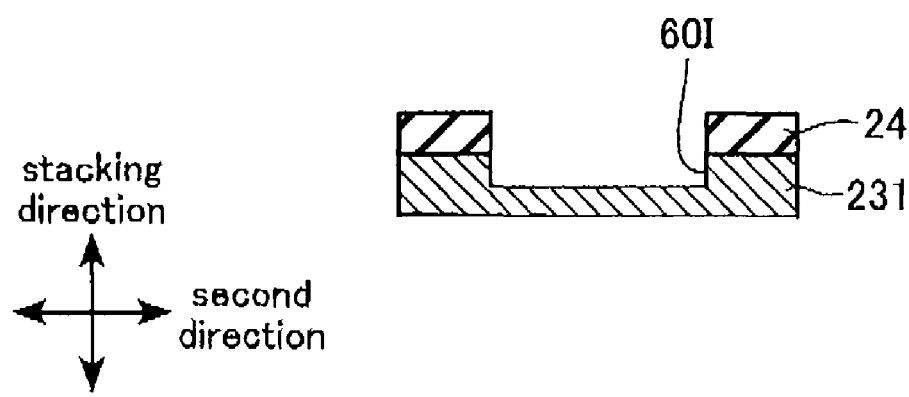
FIG. 11B is a cross-sectional view taken along a line C-C' in FIG. 11A.

Next, a configuration of a semiconductor device in accordance with an eleventh embodiment is described with reference to FIGS. 11A and 11B. FIG. 11A is an enlarged top view of the semiconductor chip in the semiconductor device in accordance with the eleventh embodiment, and FIG. 11B is a cross-sectional view taken along a line C-C' in FIG. 11A. As shown in FIGS. 11A and 11B, the semiconductor device in accordance with the eleventh embodiment includes a connecting portion 231Ci that differs from the first through tenth embodiments. Note that in the eleventh embodiment, identical symbols are assigned to configurations similar to those in the first through tenth embodiments and descriptions thereof are omitted.

The connecting portion 231Ci includes etched portions 60I, as shown in FIGS. 11A and 11B. The etched portion 60I is configured by a recess formed by half-etching of the fourth wiring layer 231. That is to say, the etched portion 60I is shaped such that the fourth wiring layer 231 has an upper portion thereof removed and a lower portion thereof remained. An upper surface of the connecting portion 231Ci, excluding the etched portions 60I, is covered by the protective layer 24. The etched portion (recess) 60I is formed in a rectangular shape that is long in the first direction. The etched portions (recesses) 60I are formed so as to be lined up in the second direction.

The semiconductor device in accordance with the eleventh embodiment has a substantially similar configuration to that of the first embodiment, and therefore has the same advantages as that of the first embodiment. Furthermore, since the fourth wiring layer 231 is remained in the etched portion 60I, electrical resistance can be lowered.

Other Embodiments

This concludes description of embodiments of the semiconductor device (in accordance with the present invention), but it should be noted that the present invention is not limited to the above-described embodiments, and that various alterations, additions, substitutions, and so on, are possible within a range not departing from the scope and spirit of the invention.

Figure 12:
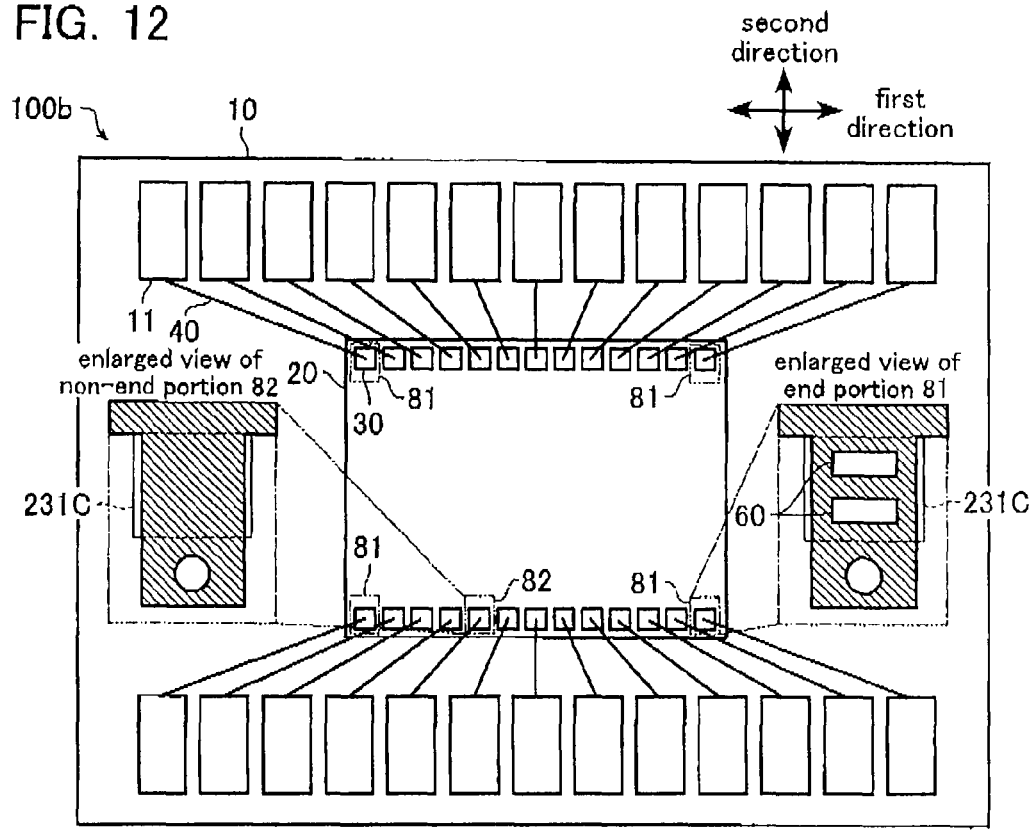
FIG. 12 is a top view of a semiconductor device 100$b$ in accordance with another embodiment of the present invention.

The vibration which is a problem to be solved in the present invention occurs easily in an end portion of the semiconductor chip 20. Consequently, as shown in FIG. 12, for example, a semiconductor device 100b may have the etched portions 60 provided only in the connecting portion 231C positioned at an end portion 81 in the first direction of the semiconductor chip 20. That is to say, the etched portions 60 may not be provided in the connecting portion 231C positioned at a non-end portion 82 that is another portion other than the end portion 81. As a result, electrical resistance of the fourth wiring layer 231 other than in the end portion 81 can be lowered.

Figure 13:
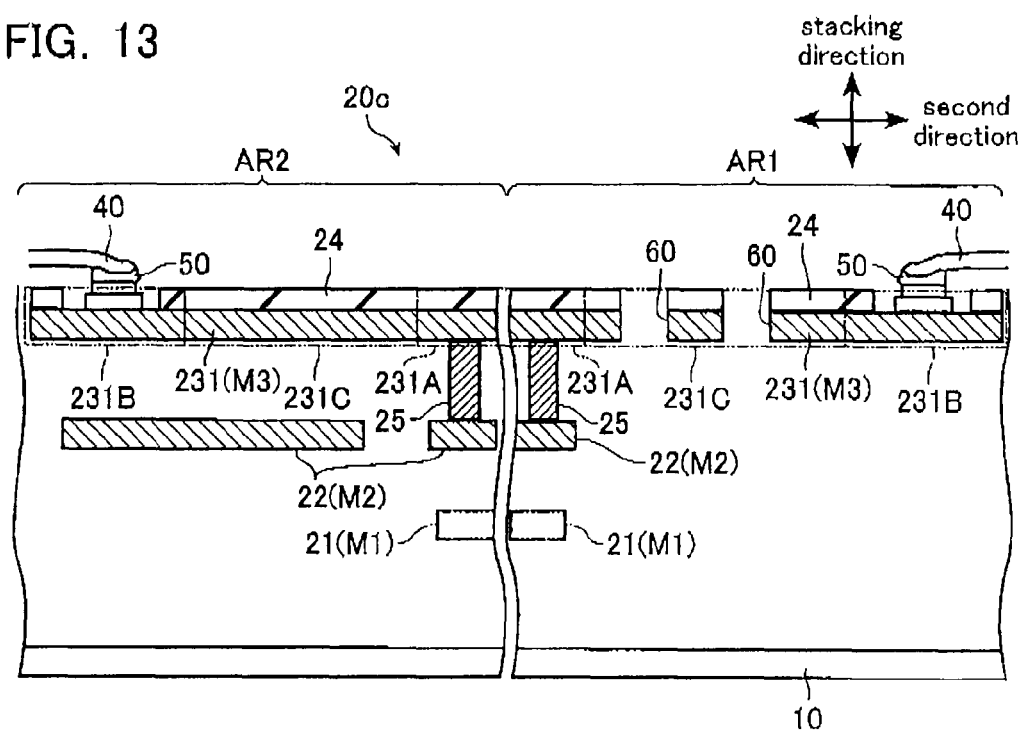
FIG. 13 is a cross-sectional view of a semiconductor chip 20$c$ in accordance with another embodiment of the present invention.

The vibration which is a problem to be solved in the present invention does not occur easily in a layer positioned in an upper layer of a metallic layer with low hardness or the like. Consequently, as shown in FIG. 13, a semiconductor chip 20c has a region AR1 where the metallic layer such as the second wiring layer 22 is not positioned directly below the bonding portion 231B. The etched portions 60 may be provided in the connecting portion 231C connected to the bonding portion 231B only in the region AR1. That is to say, as shown in FIG. 13, the semiconductor chip 20c has a region AR2 where the metallic layer such as the second wiring layer 22 is positioned directly below the bonding portion 231B. The etched portions 60 may not be provided in the connecting portion 231C connected to the bonding portion 231 in the region AR2. The etched portions 60 may be formed only in the connecting portion 231C positioned above an insulating layer provided in a same layer as the second wiring layer 22. That is, a resistance of the fourth wiring layer 231 formed in the region excepted the region AR1 can be reduced.

In addition, if a material of the wire 40 is a metal like copper that is hard in comparison to gold, then the vibration (resonance) during attaching of the wire becomes stronger and faulty connection increases. However, if the etched portion (the etched portions) are included in the connecting portion as in the present invention, then faulty connection can be reduced even if the material of the wire 40 is copper.

What is claimed is:

1. A semiconductor device, comprising:
a substrate; and
a chip formed on said substrate and electrically connected to said substrate by a wire,
said chip comprising:
a wiring layer electrically connected to said wire; and
a protective layer formed on said wiring layer,
said wiring layer comprising:
a wiring portion having said protective layer formed in an upper surface thereof and being electrically connected to another layer at a lower layer thereof;
a bonding portion connected to one end of said wire at an exposed surface thereof, said exposed surface not having said protective layer formed in an upper layer thereof; and
a connecting portion extending in a certain direction so as to join said wiring portion and said bonding portion, and formed projecting from said wiring portion,
said bonding portion being provided at an extremity of said connecting portion,
said connecting portion comprising an etched portion formed by digging out said wiring layer.

2. The semiconductor device according to claim 1, wherein
said chip is stacked on said substrate in a plurality.

3. The semiconductor device according to claim 1, wherein
the bonding portion is applied a ground voltage.

4. The semiconductor device according to claim 1, wherein
said etched portion is configured as a through hole formed so as to penetrate said wiring layer.

5. The semiconductor device according to claim 1, wherein
said etched portion is configured as a recess having an upper surface of said wiring layer removed.

6. The semiconductor device according to claim 1, wherein
said connecting portion includes said etched portion in a plurality, and
said etched portion is formed in a rectangular shape extending in a first direction orthogonal to said certain direction, and so as to be arranged with a certain pitch in a second direction parallel to said certain direction.

7. The semiconductor device according to claim 1, wherein
said connecting portion includes said etched portion in a plurality, and
said etched portion is formed in a rectangular shape extending in a first direction orthogonal to said certain direction, and so as to have a certain pitch in a second direction parallel to said certain direction and to be alternately misaligned from a central line of said connecting portion in said first direction.

8. The semiconductor device according to claim 1, wherein
said connecting portion includes said etched portion in a plurality, and
said etched portion is formed in a rectangular shape extending in a second direction parallel to said certain direction, and so as to be arranged with a certain pitch in a first direction orthogonal to said certain direction.

9. The semiconductor device according to claim 1, wherein
said connecting portion includes said etched portion in a plurality, and
said etched portion is formed in a square shape, and so as to be positioned in a matrix formation in a first direction orthogonal to said certain direction and in a second direction parallel to said certain direction.

10. The semiconductor device according to claim 1, wherein
said connecting portion includes said etched portion in a plurality,
said etched portion is formed in a square shape, and
said etched portion arranged in a second direction parallel to said certain direction is formed so as to be alternately misaligned from a central line of said connecting portion in a first direction orthogonal to said certain direction.

11. The semiconductor device according to claim 1, wherein
said connecting portion includes said etched portion in a plurality,
said etched portion is configured in a cross shape extending in a first direction orthogonal to said certain direction and a second direction parallel to said certain direction, and
said etched portion is provided in an even number at a $(2n-1)$th position in said second direction and is provided in an odd number at a $(2n)$th position in said second direction, n being a natural number.

12. The semiconductor device according to claim 11, wherein
said etched portion included in said connecting portion in a plurality is formed with a width of a first length and provided with a spacing of said first length in said first direction.

13. The semiconductor device according to claim 1, wherein
said connecting portion includes said etched portion in a plurality,
said etched portion is configured as a pair of L shapes,
one of said pair of L shapes has a shape that is the other of said pair of L shapes rotated 180° in a predetermined plane, and
said etched portion configured as the pair of L shapes is formed so as to be alternately misaligned from a central line of said connecting portion in a first direction orthogonal to said certain direction.

14. The semiconductor device according to claim 1, wherein
said connecting portion includes said etched portion in a plurality,
said etched portion is configured as a pair of U shapes,
one of said pair of U shapes has a shape that is the other of said pair of U shapes rotated 180° in a predetermined plane, and
said etched portion configured as the pair of U shapes is formed so as to be alternately misaligned from a central line of said connecting portion in a first direction orthogonal to said certain direction.

15. The semiconductor device according to claim 1, wherein
said connecting portion includes said etched portion in a plurality,
said etched portion has a shape extending in a first direction orthogonal to said certain direction from one edge or the other edge of said connecting portion towards a center of said connecting portion in said first direction,
said etched portion at a first position in a second direction parallel to said certain direction is formed so as to extend from one end in said first direction of said connecting portion, and
said etched portion at a second position adjacent to said first position in said second direction is formed so as to extend from the other edge in said first direction of said connecting portion.

16. The semiconductor device according to claim 1, wherein
said etched portion is formed only in said wiring portion extending from an end portion position of said wiring portion in a first direction orthogonal to said certain direction.

17. The semiconductor device according to claim 1, wherein
said bonding portion and said connecting portion are located at an edge of said chip.

18. The semiconductor device according to claim 2, wherein
said chip is stacked with a spacer chip interposed therebetween, and
wherein
said spacer chip is provided on said chip so as to avoid above or below said bonding portion in said chip.

19. The semiconductor device according to claim 1, wherein
said chip further comprises:
a first layer formed in a same layer as said wiring layer and electrically connected to said wire, and
a current flowing in said wiring layer is greater than a current flowing in said first layer.

20. The semiconductor device according to claim 1, wherein
said wire is constituted by copper.

21. The semiconductor device according to claim 1, wherein
said connecting portion, said bonding portion, and said wiring portion are provided in a same layer.

22. The semiconductor device according to claim 1, wherein
said etched portion etches said protective layer and said connecting portion.

* * * * *